(12) United States Patent
Park et al.

(10) Patent No.: US 9,685,211 B2
(45) Date of Patent: Jun. 20, 2017

(54) NONVOLATILE MEMORY DEVICES AND STORAGE DEVICES INCLUDING NONVOLATILE MEMORY DEVICES

(71) Applicant: Samsung Electronics Co., Ltd., Suwon-si (KR)

(72) Inventors: Jeunghwan Park, Suwon-si (KR); Sunghoon Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/018,180

(22) Filed: Feb. 8, 2016

(65) Prior Publication Data

US 2016/0276001 A1 Sep. 22, 2016

(30) Foreign Application Priority Data

Mar. 20, 2015 (KR) .................. 10-2015-0039042

(51) Int. Cl.
| | |
|---|---|
| *G11C 5/06* | (2006.01) |
| *G11C 7/18* | (2006.01) |
| *G11C 16/26* | (2006.01) |
| *H01L 27/02* | (2006.01) |
| G11C 5/02 | (2006.01) |
| G11C 7/10 | (2006.01) |
| *H01L 27/11573* | (2017.01) |
| *H01L 27/11582* | (2017.01) |

(52) U.S. Cl.
CPC ............ *G11C 7/18* (2013.01); *G11C 7/106* (2013.01); *G11C 16/26* (2013.01); *H01L 27/0207* (2013.01); *G11C 5/02* (2013.01); *G11C 5/06* (2013.01); *G11C 7/1039* (2013.01); *H01L 27/11573* (2013.01); *H01L 27/11582* (2013.01)

(58) Field of Classification Search
CPC .. G11C 16/0433; G11C 5/06; H01L 27/11582
USPC ............ 365/185.01, 185.05, 51, 63; 257/316
See application file for complete search history.

(56) References Cited

U.S. PATENT DOCUMENTS 6,927,443 B2 * 8/2005 Arigane ................ H01L 27/115
257/298
6,980,462 B1 12/2005 Ramesh et al.
(Continued)

FOREIGN PATENT DOCUMENTS

JP 2003204001 A 7/2003
JP 2007011077 A 1/2007
(Continued)

*Primary Examiner* — Son Mai
(74) *Attorney, Agent, or Firm* — Myers Bigel, P.A.

(57) ABSTRACT

The inventive concepts relate to nonvolatile memory devices. The nonvolatile memory devices may include a memory cell array, and a page buffer circuit connected to the memory cell array through bit lines. The page buffer circuit may comprise a substrate, bit line selection transistors on the substrate and connected to respective ones of the bit lines, and latches on the substrate connected to the bit line selection transistors through lines. The lines may be on a first plane above and parallel to a top surface of the substrate, and may be connected to respective ones of the bit line selection transistors through first contacts. The bit lines may be on a second plane above and parallel to a top surface of the substrate, and may be connected to respective ones of the bit line selection transistors through second contacts.

20 Claims, 13 Drawing Sheets

(56) References Cited

U.S. PATENT DOCUMENTS

| | | | |
|---|---|---|---|
| 7,157,305 B2 * | 1/2007 | Prall | G11C 16/04 |
| | | | 438/201 |
| 7,494,871 B2 * | 2/2009 | Lee | H01L 27/115 |
| | | | 257/E21.682 |
| 7,679,133 B2 | 3/2010 | Son et al. | |
| 7,869,273 B2 | 1/2011 | Lee et al. | |
| 8,040,726 B2 | 10/2011 | Kwak | |
| 8,493,768 B2 | 7/2013 | Byun et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2003/0085421 A1 | 5/2003 | Takeuchi et al. | |
| 2004/0212023 A1 * | 10/2004 | Umezawa | G11C 16/0433 |
| | | | 257/390 |
| 2004/0213045 A1 * | 10/2004 | Nakai | G11C 7/1051 |
| | | | 365/185.13 |
| 2005/0184329 A1 * | 8/2005 | Prall | G11C 16/04 |
| | | | 257/314 |
| 2006/0055045 A1 | 3/2006 | Park et al. | |
| 2007/0013074 A1 | 1/2007 | Kodaira et al. | |
| 2011/0233648 A1 | 9/2011 | Seol et al. | |
| 2013/0163365 A1 | 6/2013 | Lee | |
| 2013/0228846 A1 * | 9/2013 | La Rosa | H01L 29/7889 |
| | | | 257/321 |
| 2014/0097481 A1 * | 4/2014 | La Rosa | H01L 29/788 |
| | | | 257/315 |

FOREIGN PATENT DOCUMENTS

| | | |
|---|---|---|
| JP | 2009027183 A | 2/2009 |
| JP | 2010538409 A | 12/2010 |
| KR | 20040052018 A | 6/2004 |
| KR | 20060023866 A | 3/2006 |
| KR | 100751677 B1 | 8/2007 |
| KR | 20110047604 A | 5/2011 |

* cited by examiner

NONVOLATILE MEMORY DEVICES AND STORAGE DEVICES INCLUDING NONVOLATILE MEMORY DEVICES

CROSS-REFERENCE TO RELATED APPLICATION

This U.S. non-provisional patent application claims priority under 35 U.S.C. §119 to Korean Patent Application No. 10-2015-0039042, filed on Mar. 20, 2015, the disclosure of which is incorporated herein in its entirety by reference.

BACKGROUND

The inventive concepts relate to semiconductor memories, and more particularly, to storage devices including semiconductor memories and operating methods thereof.

A storage device is a device storing data under the control of a host device such as a computer, a smart phone, a smart pad, etc. A storage device may include a device storing data in a magnetic disk such as a HDD (hard disk drive) and a device storing data in a semiconductor memory. In some embodiments, a storage device may include a nonvolatile memory such as an SSD (solid state drive), a memory card, etc.

Examples of a nonvolatile memory may include a ROM (read only memory), a PROM (programmable ROM), an EPROM (electrically programmable ROM), an EEPROM (electrically erasable and programmable ROM), a flash memory, a PRAM (phase-change RAM), a MRAM (magnetic RAM), a RRAM (resistive RAM), a FRAM (ferroelectric RAM), etc.

As semiconductor manufacturing technology develops, the integration and capacity of nonvolatile memory and storage devices are continuously increasing. Higher integration of nonvolatile memory and storage devices has the advantage of reducing production costs. However, as the scale of nonvolatile memory and storage devices is reduced, and the structure of these devices is changed due to the higher integration, various problems that were not previously known are arising. These problems may damage data stored in the nonvolatile memory or storage device, and thereby degrade the reliability of these devices.

SUMMARY

Embodiments of the inventive concepts provide nonvolatile memory devices. The nonvolatile memory devices may include a memory cell array and a page buffer circuit connected to the memory cell array through bit lines. The page buffer circuit may comprise a substrate, bit line selection transistors on the substrate and connected to respective ones of the bit lines, and latches on the substrate and connected to the bit line selection transistors through lines. The lines may be on a first plane above, and parallel to, a top surface of the substrate, and may be connected to respective ones of the bit line selection transistors through first contacts. The bit lines may be on a second plane above and parallel to a top surface the substrate, and are connected to respective ones of the bit line selection transistors through second contacts.

Embodiments of the inventive concepts also provide storage devices. The storage devices may include a nonvolatile memory device and a memory controller configured to control the nonvolatile memory. The nonvolatile memory may comprise a memory cell array and a page buffer circuit connected to the memory cell array through bit lines. The page buffer circuit may comprise a substrate, bit line selection transistors on the substrate and connected to respective ones of the bit lines, and latches on the substrate connected to the bit line selection transistors through lines. The lines may be on a first plane above, and parallel to, a top surface of the substrate, and may be connected to the bit line selection transistors through first contacts respectively. The bit lines are formed on a second plane above the substrate parallel to the substrate and are connected to the bit line selection transistors through second contacts.

Embodiments of the inventive concepts also provide nonvolatile memory devices. The nonvolatile memory devices may include a memory cell array and a page buffer circuit. The page buffer circuit may comprise a substrate, a plurality of layers above the substrate, lines disposed in a first layer of the plurality of layers, bit lines disposed in a second layer of the plurality of layers, a plurality of floating lines disposed in the second layer, a plurality of bit line selection transistors on the substrate and connected to respective ones of the bit lines, and a plurality of latches on the substrate and connected to the plurality of bit line selection transistors through the lines. Respective ones of the plurality of layers may be parallel to a top surface of the substrate. The bit lines may connect the page buffer circuit to the memory cell array

BRIEF DESCRIPTION OF THE FIGURES

Embodiments of the inventive concepts will be described below in more detail with reference to the accompanying drawings. The inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art. Like numbers refer to like elements throughout.

DETAILED DESCRIPTION

Figure 1:
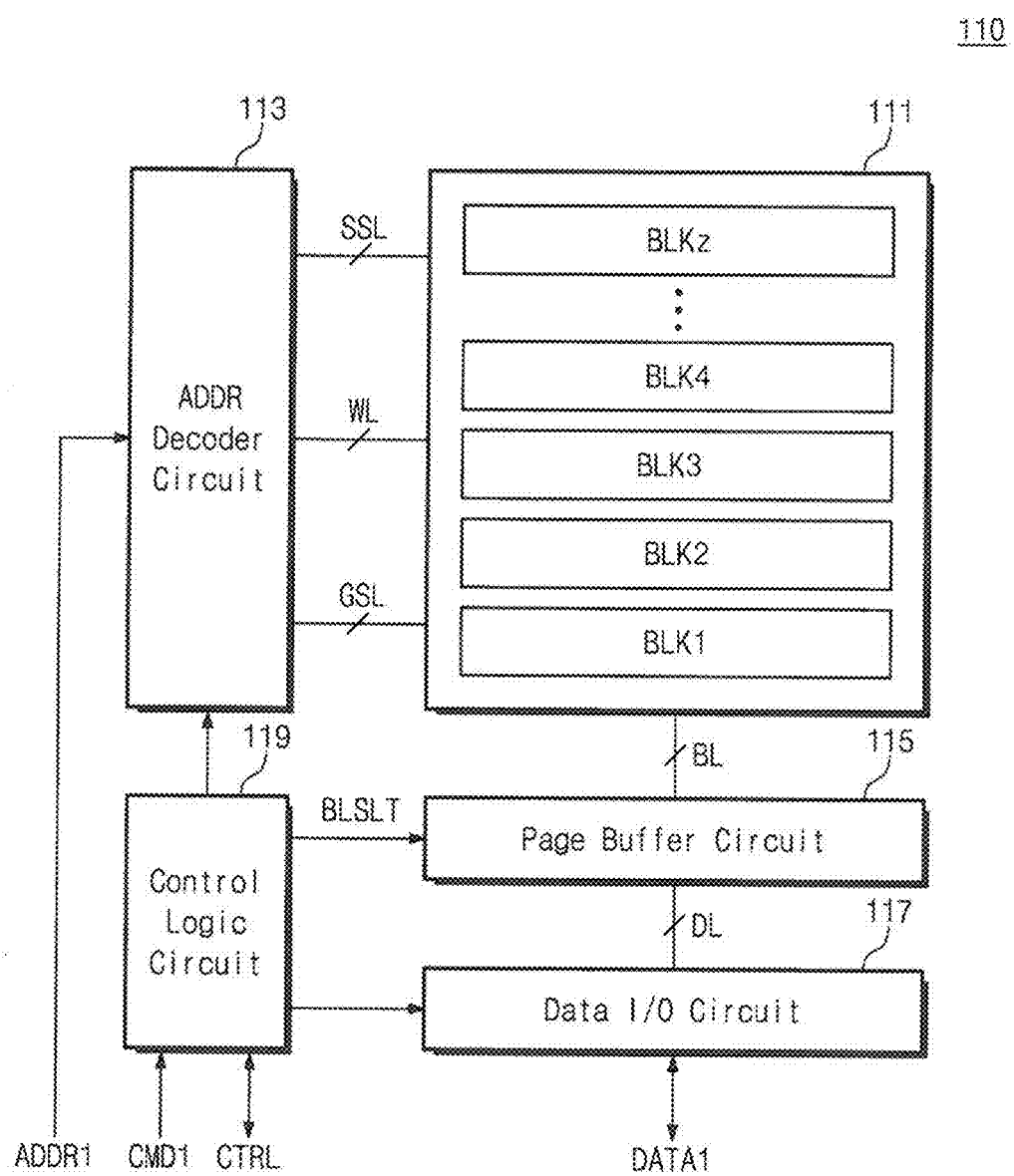
FIG. 1 is a block diagram illustrating a nonvolatile memory in accordance with example embodiments of the inventive concepts.

Embodiments of inventive concepts will be described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that although the terms "first", "second", etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

It is to be understood that the functions/acts described for the example embodiments may occur out of the order noted in the operational illustrations and description. For example, two steps of a process described in succession may in fact be executed substantially concurrently or the steps may sometimes be executed in the reverse order, depending upon the functionality/acts involved. Although some of the diagrams include arrows on communication paths to show a primary direction of communication, it is to be understood that communication may occur in the opposite direction to the depicted arrows.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in the same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

FIG. 1 is a block diagram illustrating a nonvolatile memory in accordance with example embodiments of the inventive concepts. Referring to FIG. 1, the nonvolatile memory 110 includes a memory cell array 111, an address decoder circuit 113, a page buffer circuit 115, a data input/output circuit 117 and a control logic circuit 119.

The memory cell array 111 can include a plurality of memory blocks BLK1 to BLKz. Each memory block includes a plurality of memory cells. Each memory block may be connected to the address decoder circuit 113 through at least one ground select line GSL, a plurality of word lines WL and at least one string select line SSL. Each memory block may be connected to the page buffer circuit 115 through a plurality of bit lines BL. The memory blocks BLK1 to BLKz may be connected to share the bit lines BL in common. Memory cells of the memory blocks BLK1 to BLKz may have the same structure. Each of the memory blocks BLK1 to BLKz may be a unit of an erase operation. Memory cells of the memory cell array 111 may be erased by a memory block unit. Memory cells that belong to one memory block may be erased at the same time. Each memory block may be divided into a plurality of sub blocks. Each of the sub blocks may be a unit of an erase operation.

The address decoder circuit 113 may be connected to the memory cell array 111 through a plurality of ground select lines GSL, a plurality of word lines WL and a plurality of string select lines SSL. The address decoder circuit 113 may operate under the control of the control logic circuit 119. The address decoder circuit 113 may receive a first address ADDR1 from a memory controller 120 (as shown, for example, in FIG. 12). The address decoder circuit 113 decodes the received first address ADDR1 and can control the voltages being applied to the word lines WL according to the decoded address.

For example, in a program operation, the address decoder circuit 113 may apply a program voltage VGPM to a selected word line of a selected memory block which the first address ADDR1 indicates and may apply a pass voltage VPASS to unselected word lines of the selected memory block. In a read operation, the address decoder circuit 113 may apply a select read voltage VRD to a selected word line of a selected memory block which the first address ADDR1 indicates and may apply an unselect read voltage VREAD to unselected word lines of the selected memory block. In an erase operation, the address decoder circuit 113 may apply erase voltages (for example, an erase voltage or low voltages having levels similar to the ground voltage) to word lines of a selected memory block which the first address ADDR1 indicates.

The page buffer circuit 115 may be connected to the memory cell array 111 through a plurality of bit lines BL. The page buffer circuit 115 may be connected to the data input/output circuit 117 through a plurality of data lines DL. The page buffer circuit 115 may operate under the control of the control logic circuit 119.

The page buffer circuit 115 can store data to be programmed in memory cells of the memory cell array 111 or data being read from memory cells of the memory cell array 111. In a program operation, the page buffer circuit 115 can store data to be programmed in memory cells. The page buffer circuit 115 can bias a plurality of bit lines BL on the basis of the stored data. In a program operation, the page buffer circuit 115 can function as a write driver. In a read operation, the page buffer circuit 115 can sense voltages of bit lines BL and store a sensing result. In a read operation, the page buffer circuit 115 can function as a sense amplifier. The page buffer circuit 115 can control the bit lines BL in response to a control signal BLSLT. For example, the page buffer circuit 115 can supply voltages to the bit lines BL when the control signal BLSLT is activated. The page buffer circuit 115 can float the bit lines BL when the control signal BLSLT is not activated.

The data input/output circuit 117 is connected to the page buffer circuit 115 through a plurality of data lines DL. The data input/output circuit 117 can exchange first data DATA1 with the memory controller 120.

The data input/output circuit 117 can temporarily store first data DATA1 being received from the memory controller 120. The data input/output circuit 117 can transmit the stored data to the page buffer circuit 115. The data input/output circuit 117 can temporarily store data being transmitted from the page buffer circuit 115. The data input/output circuit 117 can transmit the stored data to the memory controller 120 as the first data DATA1. The data input/output circuit 117 can function as a buffer memory.

The control logic circuit 119 receives a first command CMD1 and a control signal CTRL from the memory controller 120. The control logic circuit 119 can decode the received first command CMD1 and control the overall operation of the nonvolatile memory 110 according to the decoded command. For example, the control logic circuit 119 can transmit the control signal BLSLT to the page buffer circuit 115.

In a read operation, the control logic circuit 119 can generate a data strobe signal DQS from a read enable signal /RE among the received control signal CTRL and output it. In a write operation, the control logic circuit 119 can receive a data strobe signal DQS included in the control signal CTRL.

Figure 2:
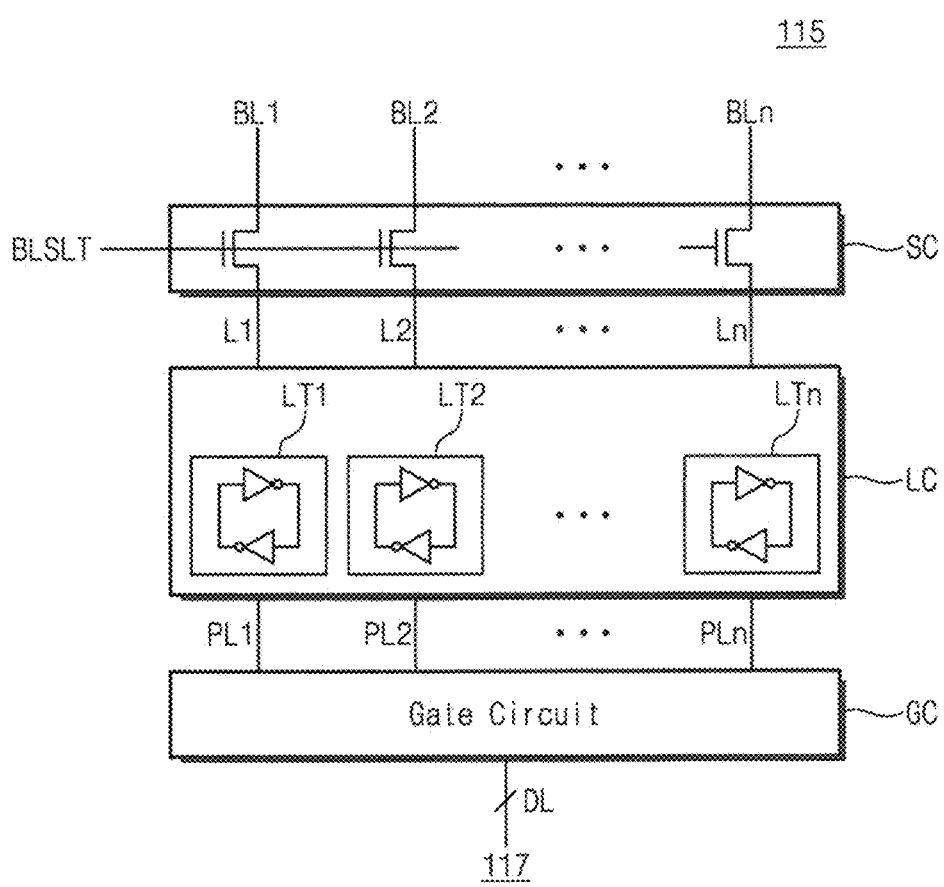
FIG. 2 illustrates a page buffer circuit in accordance with example embodiments of the inventive concepts.

FIG. 2 illustrates a page buffer circuit in accordance with example embodiments of the inventive concepts. Referring to FIGS. 1 and 2, the page buffer circuit 115 may include a selection circuit SC, a latch circuit LC and a gate circuit GC.

The selection circuit SC may include bit line selection transistors corresponding to bit lines BL1 to BLn respectively. The bit line selection transistors may be connected between the bit lines BL1 to BLn and lines L1 to Ln. The bit line selection transistors may operate in response to the control signal BLSLT. For example, if the control signal BLSLT is activated, the bit line selection transistors can electrically connect the bit lines BL1 to BLn and the lines L1 to Ln. If the control signal BLSLT is not activated, the bit line selection transistors can electrically separate the bit lines BL1 to BLn from the lines L1 to Ln. For example, the bit lines BL1 to BLn may be floated.

The latch circuit LC may include latches LT1 to LTn corresponding to the bit lines BL1 to BLn respectively. The latches LT1 to LTn of the latch circuit LC can apply voltages to the lines L1 to Ln based on stored data. The voltages being applied to the lines L1 to Ln may be transmitted to the bit lines BL1 to BLn through the selection circuit SC. The latches LT1 to LTn of the latch circuit LC can perform a latch operation based on the voltages of the lines L1 to Ln. For example, a latch operation can be performed based on the voltages being transmitted to the lines L1 to Ln through the selection circuit SC. The latches LT1 to LTn of the latch circuit LC may be connected to page lines PL1 to PLn respectively.

The gate circuit GC is connected between the page lines PL1 to PLn and data lines DL. For example, the number of the data lines DL may be smaller than the number of page lines PL1 to PLn. In response to the control logic circuit 119, the gate circuit GC can electrically connect lines of a group selected from among the page lines PL1 to PLn to the data lines DL.

Figure 3:
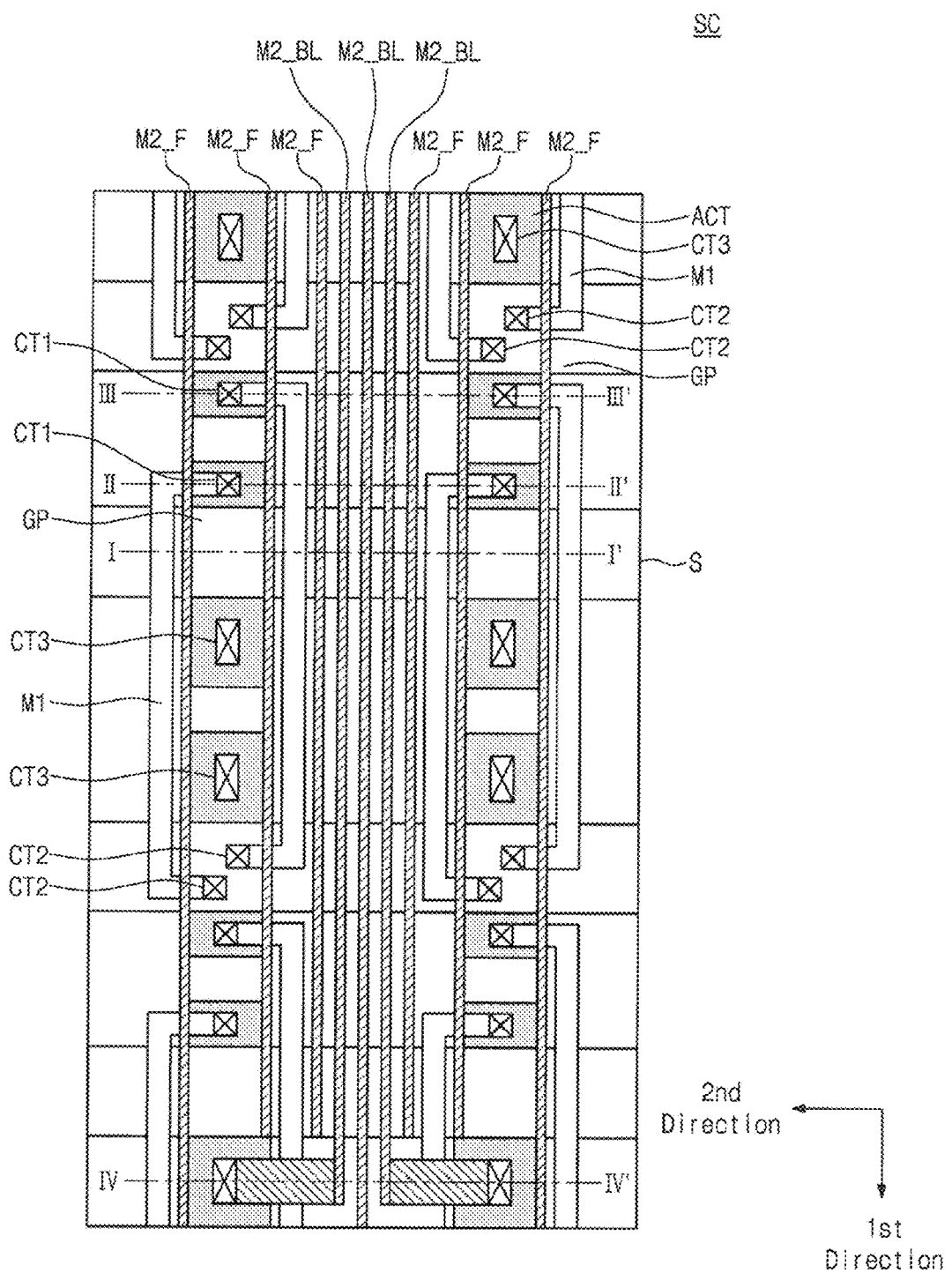
FIG. 3 is a top plan view illustrating a part of a selection circuit in accordance with example embodiments of the inventive concepts.
Figure 4:
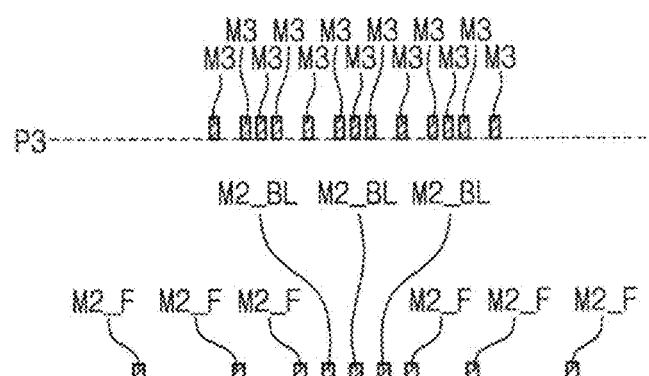
FIG. 4 is a cross sectional view taken along the line I-I' of FIG. 3.
Figure 4:
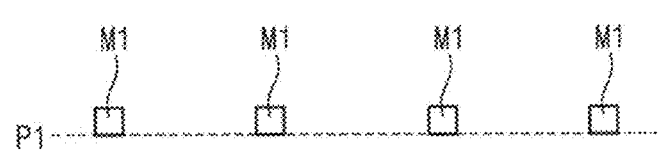
Figure 4:
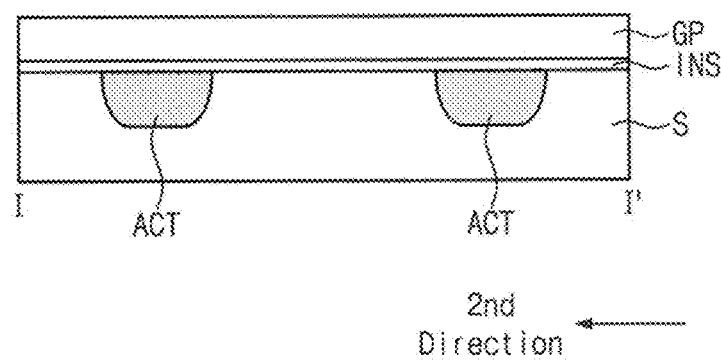
Figure 5:
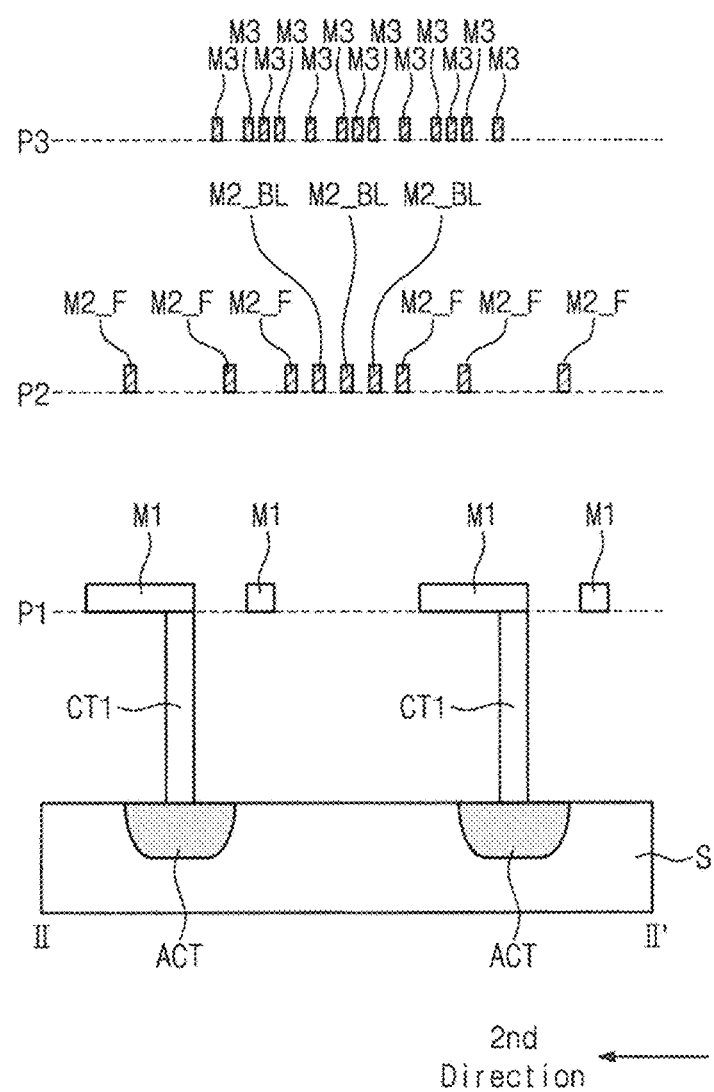
FIG. 5 is a cross sectional view taken along the line II-II' of FIG. 3.
Figure 6:
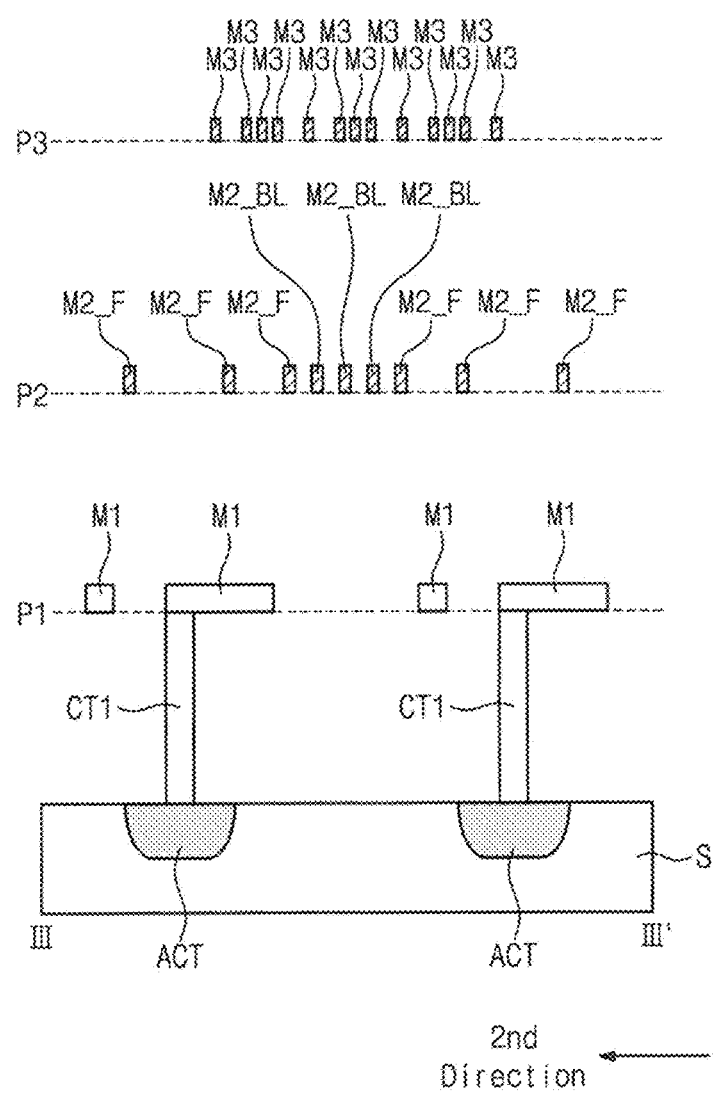
FIG. 6 is a cross sectional view taken along the line III-III' of FIG. 3.
Figure 7:
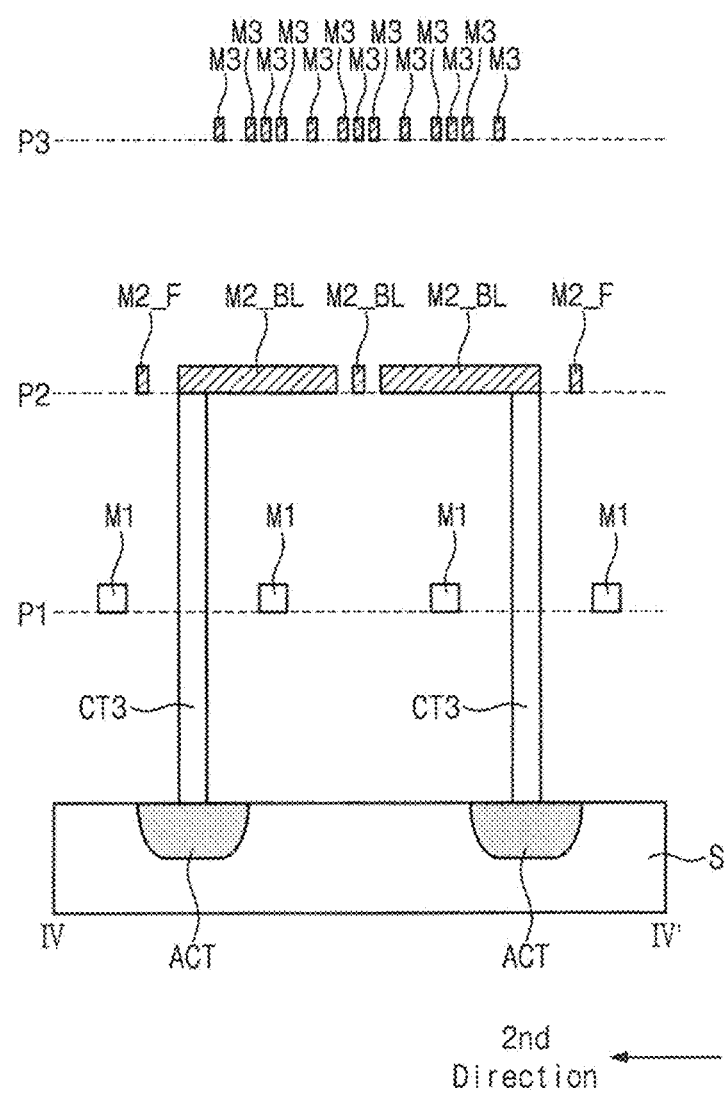
FIG. 7 is a cross sectional view taken along the line IV-IV' of FIG. 3.

FIG. 3 is a top plan view illustrating a part of a selection circuit in accordance with example embodiments of the inventive concepts. FIG. 4 is a cross sectional view taken along the line I-I' of FIG. 3. FIG. 5 is a cross sectional view taken along the line II-II' of FIG. 3. FIG. 6 is a cross sectional view taken along the line III-III' of FIG. 3. FIG. 7 is a cross sectional view taken along the line IV-IV' of FIG. 3.

Referring to FIGS. 3 and 4, the selection circuit SC may be provided on a substrate S. Active regions ACT may be formed in the substrate S. Each of the active regions ACT may correspond to one bit line selection transistor. Each of the active regions ACT may include a source region and a drain region doped with a first conductivity type impurity and a channel region doped with a second conductivity type impurity.

Gate patterns GP are formed on the channel regions of the active regions ACT. The gate patterns GP may include conductive material such as polysilicon. The gate patterns GP may operate gates of the bit line selection transistor. First conductive lines M1 may be disposed on a first plane P1 parallel to a top surface of the substrate S. Second conductive lines M2_BL and M2_F may be disposed on a second plane P2 parallel to the top surface of the substrate S and located on the first plane P1. Third conductive lines M3 may be disposed on a third plane P3 parallel to the top surface of the substrate S and located on the second plane P2. For brevity of description, the third plane P3 and the third conductive lines M3 are omitted in FIG. 3.

Referring to FIGS. 3, 5 and 6, first contacts CT1 may be connected to first regions (for example, source regions or drain regions) of the active regions ACT. The first contacts CT1 may be connected to the first conductive lines M1 formed on the first plane P1 parallel to the substrate S and located on the substrate S. Respective lines of the first conductive lines M1 may be connected to a corresponding line from among first partial lines of the third conductive lines M3 of the third plane P3 through a second contact CT2. The first conductive lines M1 of the first plane P1 and/or the first partial lines of the third conductive lines M3 of the third plane P3 which are electrically connected to the first regions of the active regions ACT may form the lines L1 to Ln being connected to the latches LT1 to LTn of the latch circuit LC.

Referring to FIGS. 3 and 7, third contacts CT3 may be connected to second regions (for example, drain regions or source regions) of the active regions ACT. First partial contacts of the third contacts CT3 may be connected to partial lines M2_BL of the second conductive lines M2 of the second plane P2. Second partial contacts of the third contacts CT3 may be connected to second partial lines of the third conductive lines M3 of the third plane P3. The partial lines M2_BL of the second conductive lines M2 of the second plane P2 which are electrically connected to the second regions of the active regions ACT, and the second partial lines of the third conductive lines M3 of the third plane P3, may form the bit lines BL1 to BLn.

As illustrated in FIGS. 3 through 6, in the second plane P2, floating lines M2_F may be disposed at a location adjacent the first conductive lines M1. For example, the floating lines M2_F may not be electrically connected to another voltage/current source/sink. The floating lines M2_F may reduce a coupling between first conductive lines M1 and the partial lines of the second conductive lines M2_BL being used as the bit lines BL1 to BLn.

As illustrated in FIG. 3, first bit line selection transistors may be sequentially disposed along a first direction. Second bit line selection transistors may be disposed in parallel to the first bit line selection transistors along the first direction.

The first conductive lines M1 may extend along a second direction (or a direction opposite to the second direction) from the first contacts CT1, turn in the first direction to extend along the first direction, and turn in the direction opposite to the second direction (or the second direction) to be connected to the second contacts CT2. One of the first conductive lines M1 may contact a first region of corresponding first bit line selection transistor (or corresponding second bit line selection transistor) through corresponding first contact CT1. The one of the first conductive lines M1 may contact corresponding second contact CT2 at an upper portion of a gate pattern GP of another first bit line selection transistor (or another second bit line selection transistor) adjacent the corresponding first bit line selection transistor (or the corresponding second bit line selection transistor).

In an area between the first bit line select transistors and the second bit line select transistors, the partial lines of the second conductive lines M2_BL being used as the bit lines BL1 to BLn may be spaced apart from one another along the second direction and may extend along the first direction. At a location around the corresponding first bit line select transistor (or the corresponding second bit line select transistor), one of the partial lines of the second conductive lines M2_BL may turn in the second direction (or the direction opposite to the second direction), extend along the second direction (or the direction opposite to the second direction), and contact a corresponding third contact CT3 on a second region of the corresponding first bit line select transistor (or the corresponding second bit line select transistor).

On the second plane P2, the floating lines M2_F may be spaced apart from one another along the second direction and may extend along the first direction at a region not crossing the partial lines of the second conductive line M2_BL being used as the bit lines BL1 to BLn. For example, the floating lines M2_F may be disposed in parallel with the partial lines of the second conductive line M2_BL being used as the bit lines BL1 to BLn.

Figure 8:
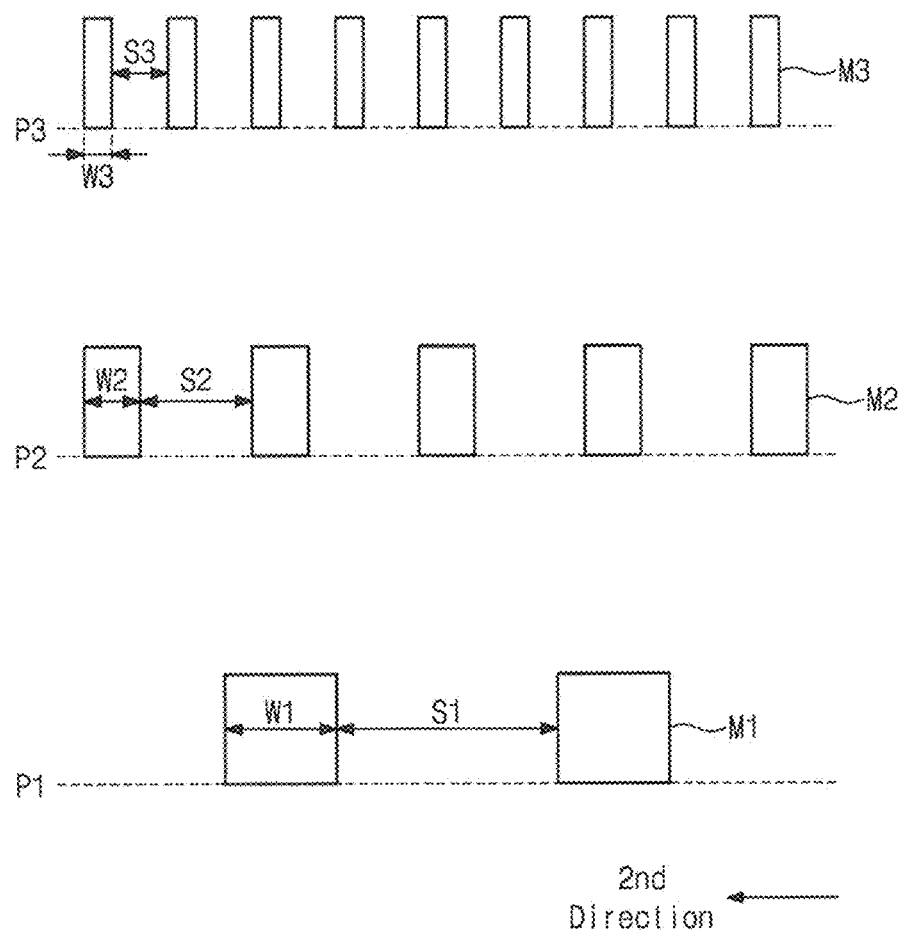
FIG. 8 illustrates first through third planes in accordance with example embodiments of the inventive concepts.

FIG. 8 illustrates first through third planes P1 to P3 in accordance with example embodiments of the inventive concepts. Referring to FIGS. 2 through 8, each of the first conductive lines M1 of the first plane P1 may have a first line width W1. A space between the first conductive lines M1 of the first plane P1 may be a first space S1. The first conductive lines M1 may form the lines L1 to Ln or a first part of the lines L1 to Ln.

Each of the second conductive lines M2 of the second plane P2 on the first plane P1 may have a second line width W2 smaller than the first line width W1. A space between the second conductive lines M2 of the second plane P2 may be a second space S2 smaller than the first space S1. The second conductive lines M2 may form a first part of the bit lines BL1 to BLn and the floating lines M2_F.

Each of the third conductive lines M3 of the third plane P3 on the second plane P2 may have a third line width W3 smaller than the second line width W2. A space between the third conductive lines M3 of the third plane P3 may be a third space S3 smaller than the second space S2. A part of the third conductive lines M3 may form a part of the lines L1 to Ln or a second part of the lines L1 to Ln. The other part of the third conductive materials M3 may form a second part of the bit lines BL1 to BLn.

As described with reference to FIGS. 3 through 8, the lines L1 to Ln or a part of the lines L1 to Ln may be formed on the first plane P1. The bit lines BL1 to BLn may not be formed on the first plane P1. The bit lines BL1 to BLn or a part of the bit lines BL1 to BLn may be formed on the second plane P2. The lines L1 to Ln may not be formed on the second plane P2.

The lines L1 to Ln may be separated from the memory cell array 111 through the selection circuit SC. Voltages being applied to the lines L1 to Ln may be lower than a power supply voltage. The bit lines BL1 to BLn may be directly connected to the memory cell array 111 and a high voltage may be supplied to the bit lines BL1 to BLn depending on a state of the memory cell array 111. For example, when erasing memory cells of the memory cell array 111, a high voltage may be supplied to the bit lines BL1 to BLn from the memory cell array 111.

Since a voltage driving range of the bit lines BL1 to BLn may be different from that of the lines L1 to Ln, a malfunction of the nonvolatile memory 110 may occur due to a coupling between the bit lines BL1 to BLn and the lines L1 to Ln. According to example embodiments of the inventive concepts, layers on which the bit lines BL1 to BLn are disposed may be separated from layers on which the lines L1 to Ln are disposed. Thus, a coupling between the bit lines BL1 to BLn and the lines L1 to Ln may be reduced. Since the floating lines M2_F may be disposed at a region adjacent the lines L1 to Ln, a coupling between the bit lines BL1 to BLn and the lines L1 to Ln may be further reduced.

Figure 9:
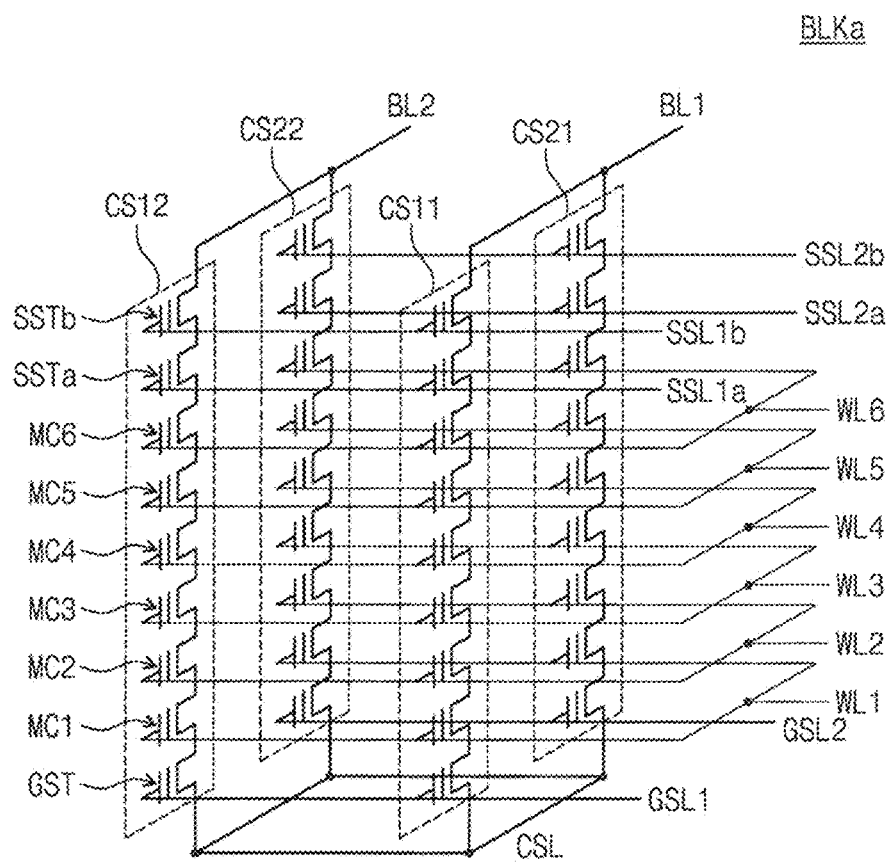
FIG. 9 is an illustrative circuit diagram illustrating a memory block of FIG. 1 in accordance with example embodiments of the inventive concepts.

FIG. 9 is an illustrative circuit diagram illustrating a memory block BLKa of FIG. 1 in accordance with example embodiments of the inventive concepts. Referring to FIGS. 1 and 9, the memory block BLKa may include a plurality of cell strings CS11 to CS21 and CS12 to CS22. The cell strings CS11 to CS21 and CS12 to CS22 may be arranged along a row direction and a column direction to form rows and columns.

For example, the cell strings CS11 and CS12 arranged along a row direction may form a first row and the cell strings CS21 and CS22 arranged along the row direction may form a second row. The cell strings CS11 and CS21 arranged along a column direction may form a first column and the cell strings CS12 and CS22 arranged along the column direction may form a second column.

Each cell string may include a plurality of cell transistors. The cell transistors include ground select transistors GST, memory cells MC1 to MC6, and string select transistors SSTa and SSTb. The ground select transistors GST, the memory cells MC1 to MC6, and the string select transistors SSTa and SSTb of each cell string may be stacked in a direction perpendicular to a plane (for example, a plane on a substrate of the memory block BLKa) on which the cell strings CS11 to CS21 and CS12 to CS22 are arranged in rows and columns.

The cell transistors may be charge trap type transistors having threshold voltages that change depending on charge amount captured by an insulating layer.

Sources of the ground select transistors GST may be connected to a common source line CSL in common.

Control gates of the ground select transistors GST of the first row cell strings CS11 and CS12 may be connected to a ground select line GSL1 in common. Control gates of the ground select transistors GST of the second row cell strings CS21 and CS22 may be connected to a ground select line GSL2 in common.

In some embodiments, the memory block BLKa may be changed so that ground select lines connected to ground select transistors of different heights of the same row are connected to one another to be controlled in common. In some embodiments, the memory block BLKa may be changed so that ground select lines connected to ground select transistors of the same height of the different rows are connected to one another to be controlled in common. In some embodiments, the memory block BLKa may be changed so that ground select lines connected to ground select transistors are connected to one another to be controlled in common.

Control gates of memory cells located at the same height (or order) from a substrate (or ground select transistors GST) may be connected to one word line in common, and control gates of memory cells located at different heights (or order) may be connected to different word lines WL1 to WL6 respectively. For example, memory cells MC1 may be connected to the word line WL1 in common. Memory cells MC2 may be connected to the word line WL2 in common. Memory cells MC3 may be connected to the word line WL3 in common. Memory cells MC4 may be connected to the word line WL4 in common. Memory cells MC5 may be connected to the word line WL5 in common. Memory cells MC6 may be connected to the word line WL6 in common.

At the first string select transistors SSTa of the same height (or order) of the cell strings CS11 to CS21 and CS12 to CS22, control gates of the first string select transistors SSTa of different rows may be connected to different string select lines SSL1a to SSL2a respectively. For example, the first string select transistors SSTa of the cell strings CS11 and CS12 may be connected to the string select line SSL1a in common. The first string select transistors SSTa of the cell strings CS21 and CS22 may be connected to the string select line SSL2a in common.

At the second string select transistors SSTb of the same height (or order) of the cell strings CS11 to CS21 and CS12 to CS22, control gates of the second string select transistors SSTb of different rows may be connected to different string select lines SSL1b to SSL2b respectively. For example, the second string select transistors SSTb of the cell strings CS11 and CS12 may be connected to the string select line SSL1b in common. The second string select transistors SSTb of the cell strings CS21 and CS22 may be connected to the string select line SSL2b in common.

That is, cell strings of different rows may be connected to different string select lines. String select transistors of the same height (or order) of cell strings of the same row may be connected to the same string select line. String select transistors of different heights (or order) of cell strings of the same row may be connected to different string select lines.

String select transistors of cell strings of the same row may be connected to one string select line in common. For example, the string select transistors SSTa and SSTb of the first row cell strings CS11 and CS12 may be connected to one string select line in common. The string select transistors SSTa and SSTb of the second row cell strings CS21 and CS22 may be connected to one string select line in common.

Columns of the cell strings CS11 to CS21 and CS12 to CS22 may be connected to different bit lines BL1 and BL2 respectively. For example, the string select transistors SST of the first column cell strings CS11 to CS21 may be connected to the bit line BL1 in common. The string select transistors SST of the second column cell strings CS12 to CS22 may be connected to the bit line BL2 in common.

The cell strings CS11 and CS12 may form a first plane. The cell strings CS21 and CS22 may form a second plane.

In the memory block BLKa, memory cells of each height of each plane may form a physical page. The physical page may be a write unit and a read unit of the memory cells MC1 to MC6. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane may be connected to the bit lines BL1 and BL2. That is, the first plane may be selected. When a turn-on voltage is supplied to the string select lines SSL2a and SSL2b and a turn-off voltage is supplied to the string select lines SSL1a and SSL1b, the cell strings CS21 and CS22 of the second plane may be connected to the bit lines BL1 and BL2. That is, the second plane may be selected. In the selected plane, one row of the memory cells MC may be selected by the word lines WL1 to WL6. In the selected row, a select voltage may be applied to the second word line WL2 and an unselect voltage may be applied to the remaining word lines WL1 and WL3 to WL6. That is, a physical page corresponding to the second word line WL2 of the second plane may be selected by controlling voltages of the string select lines SSL1a, SSL1b, SSL2a and SSL2b and the word lines WL1 to WL6. In the memory cells MC2 of the selected physical page, a write or read operation may be performed.

At least two bits may be written in each of the memory cells MC. Bits being written in each of memory cells MC that belong to one physical page may form logical pages. A first bit being written in each of memory cells MC that belong to one physical page may form a first logical page. An Nth bit being written in each of memory cells MC that belong to one physical page may form an Nth logical page. The logical page may be a data access unit. When a read operation is performed in one physical page, data may be accessed by a logical page unit.

In the memory block BLKa, an erase of the memory cells MC1 to MC6 may be performed by a memory block unit or a sub block unit. When an erase operation is performed by a memory block unit, the memory cells MC of the memory block BLKa may be all erased at the same time according to one erase request (for example, an erase request from an external memory controller). When an erase operation is performed by a sub block unit, parts of the memory cells MC1 to MC6 may be erased at the same time according to one erase request (for example, an erase request from an external memory controller) and the remaining parts of the memory cells MC1 to MC6 may be blocked from erasing. A low voltage (for example, a ground voltage or a low voltage having a similar level to the ground voltage) may be supplied to a word line connected to memory cells MC being erased and a word line connected to memory cells MC which are blocked from erasing may be floated.

While the memory block BLKa illustrated in FIG. 9 is illustrative, the inventive concepts are not limited thereto. For example, in some embodiments, the number of rows of cell strings may increase or decrease. As the number of rows of cell strings is changed, the number of string select lines or ground select lines connected to the rows of the cell strings and the number of cell strings connected to one bit line may also be changed.

In some embodiments, the number of columns of cell strings may increase or decrease. As the number of columns of cell strings is changed, the number of bit lines connected to the columns of the cell strings and the number of cell strings connected to one string select line may also be changed.

In some embodiments, heights of cell strings may increase or decrease. For example, the number of ground select transistors, memory cells or string select transistors that are stacked on each cell string may increase or decrease.

Memory cells MC that belong to one physical page can correspond to at least three logical pages. For example, k (k is an integer greater than 2) number of bits can be programmed in one memory cell MC. In memory cells MC that belong to one physical page, k number of bits being programmed in each memory cell MC can form k number of logical pages respectively.

In some embodiments of the present inventive concepts, three dimensional (3D) memory arrays may be provided. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In some embodiments of the present inventive concepts, 3D memory arrays can include vertical NAND strings that may be vertically oriented such that at least one memory cell is located over another memory cell. The at least one memory cell may comprise a charge trap layer. Each vertical NAND string may include at least one select transistor located over memory cells, the at least one select transistor having substantially the same structure with the memory cells and being formed monolithically together with the memory cells.

The following patent documents, which are hereby incorporated by reference, describe suitable configurations for three-dimensional memory arrays in which the three-dimensional memory array is configured as a plurality of levels, with word lines and/or bit lines shared between levels: U.S. Pat. Nos. 7,679,133; 8,553,466; 8,654,587; 8,559,235; and US Pat. Application Pub. No. 2011/0233648.

Figure 10:
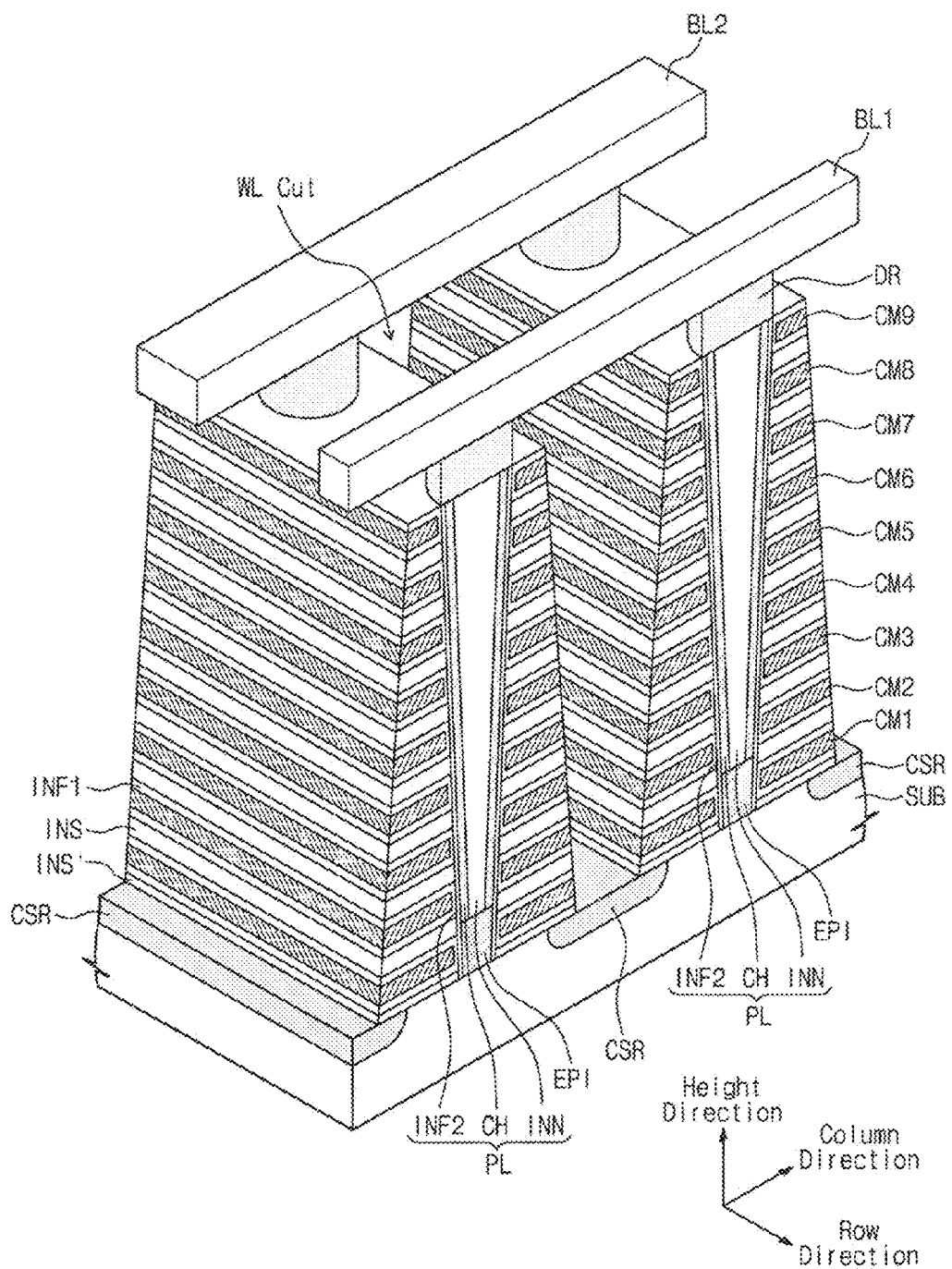
FIG. 10 is a perspective view illustrating an example structure of a memory block of FIG. 1 in accordance with example embodiments of the inventive concepts.

FIG. 10 is a perspective view illustrating an example structure of a memory block of FIG. 1 in accordance with example embodiments of the inventive concepts. Referring to FIGS. 1 and 10, common source regions CSR may be provided which extend along a row direction and may be spaced apart from one another along a column direction. The common source regions CSR may be connected in common to form a common source line CSL. A substrate SUB may include a semiconductor material (for example, silicon) having a P conductivity type. The common source region CSR may include a semiconductor material (for example, silicon) having an N conductivity type.

Between the common source regions CSR, a plurality of insulating layers INS and INS' may be sequentially stacked on the substrate SUB along a height direction (for example, a direction perpendicular to the substrate SUB). The insulating layers INS and INS' may be stacked to be spaced apart from one another along the height direction. The insulating layers INS and INS' may include an insulating material such as silicon oxide or silicon nitride. A thickness (for example, a thickness along the height direction) of the insulating layer INS' in contact with the substrate SUB among the insulating layers INS and INS' may be smaller than a thickness (for example, a thickness along the height direction) of each of the remaining other insulating layers INS.

Among the common source regions CSR, a plurality of pillars PL may be provided which may be disposed to be spaced apart from one another along a row direction and a column direction and may penetrate the insulating layers INS and INS' along the height direction. The pillars PL may penetrate the insulating layers INS and INS' to contact a silicon layer EPI provided on the substrate SUB. In some embodiments, the silicon layer EPI may be grown from the substrate SUB by a selective epitaxial growth. The silicon layer EPI may protrude from the substrate SUB along a direction perpendicular to the substrate SUB at a location of the pillar PL. The silicon layer EPI may an intrinsic or a P conductivity type.

Each of the pillars PL may include an insulating layer INF2, a channel layer CH and an internal material INN. The insulating layer INF2 may include at least two different insulating layers such as silicon oxide, silicon nitride, etc. The channel layer CH may include silicon having a P conductivity type or intrinsic silicon. The internal material INN may include an insulating layer or an air gap.

Among the common source regions CSR, insulating layers INF1 are provided on top surfaces and bottom surfaces of the insulating layers INS and INS' and exposed external surfaces of the pillars PL. In some embodiments, insulating layers INF1 being provided on a top surface of the uppermost insulating layer among the insulating layers INS and INS' may be removed. The insulating layers INF1 may include at least one insulating layer such as a silicon oxide, an aluminum oxide, etc.

Conductive materials CM1 to CM9 may be provided on exposed external surfaces of the insulating layers INF1 which may be provided among the insulating layers INS and INS'. The conductive materials CM1 to CM9 may include a metallic conductive material.

A plurality of drains DR may be provided on the pillars PL. The drains DR may include a semiconductor material (for example, silicon) having an N conductivity type. The drains DR may contact top surfaces of the channel layers CH of the pillars PL.

Bit lines BL1 and BL2 may be provided which extend along the column direction and may be spaced apart from each other along the row direction. The bit lines BL may be connected to the drains DR. The drains DR and the bit lines BL1 and BL2 may be connected through contact plugs. The bit lines BL1 and BL2 may include metallic conductive materials.

The pillars PL may form a plurality of cell strings CS11, CS12, CS21 and CS22 together with the insulating layers INF1 and INF2 and the conductive materials CM1 to CM9. Each of the pillars PL may constitute one cell string together with the insulating layers INF1 and INF2 and the conductive materials CM1 to CM9.

One pillar PL and one conductive material CM corresponding to the pillar PL can form one cell transistor. For example, the conductive material CM may operate as a control gate. The insulating layers INF1 and INF2 located between the conductive material CM and the channel layer CH of the pillar PL may form a structure of an ONO (oxide-nitride-oxide) or an ONOA (oxide-nitride-oxide-aluminum). The insulating layer INF1 may form a blocking insulating layer. A silicon nitride layer of the insulating layer INF2 may form a charge capturing layer. A silicon oxide layer of the insulating layer INF2 may form a tunneling insulating layer. That is, one conductive material CM and one pillar PL corresponding to the conductive material CM may form one charge capturing cell transistor.

The first conductive materials CM1 may operate control gates of the ground selection transistors GST respectively. The insulating layers INF1 and INF2 corresponding to the first conductive materials CM1 may form charge capturing layers of the ground selection transistors GST. The channel layers CH corresponding to the first conductive materials CM1 may operate as a vertical body of the ground selection transistors GST.

The first conductive material CM1 of a first row may form a ground select line GSL1. The first conductive material CM1 of a second row may form a ground select line GSL2.

The second through seventh conductive materials CM2 to CM7 may operate as control gates of the first through sixth memory cells MC1 to MC6 respectively. The insulating layers INF1 and INF2 corresponding to the second through seventh conductive materials CM2 to CM7 may operate as charge capturing layers of the first through sixth memory cells MC1 to MC6. The channel layers CH corresponding to the second through seventh conductive materials CM2 to CM7 may operate a vertical body of the first through sixth memory cells MC1 to MC6.

The second conductive materials CM2 may be connected in common to form a first word line WL1. The third conductive materials CM3 may be connected in common to form a second word line WL2. The fourth conductive materials CM4 may be connected in common to form a third word line WL3. The fifth conductive materials CM5 may be connected in common to form a fourth word line WL4. The sixth conductive materials CM6 may be connected in common to form a fifth word line WL5. The seventh conductive materials CM7 may be connected in common to form a sixth word line WL6.

The eighth and ninth conductive materials CM8 and CM9 may operate as control gates of the string selection transistors SSTa and SSTb respectively. The insulating layers INF1 and INF2 corresponding to the eighth and ninth conductive materials CM8 and CM9 may operate as charge capturing layers of the string selection transistors SSTa and SSTb. The channel layers CH corresponding to the eighth and ninth conductive materials CM8 and CM9 may operate as a vertical body of the string selection transistors SSTa and SSTb.

The eighth conductive material CM8 of the first row may form a string selection line SSL1a. The ninth conductive material CM9 of the first row may form a string selection line SSL1b. The eighth conductive material CM8 of the second row may form a string selection line SSL2a. The ninth conductive material CM9 of the second row may form a string selection line SSL2b.

Figure 11:
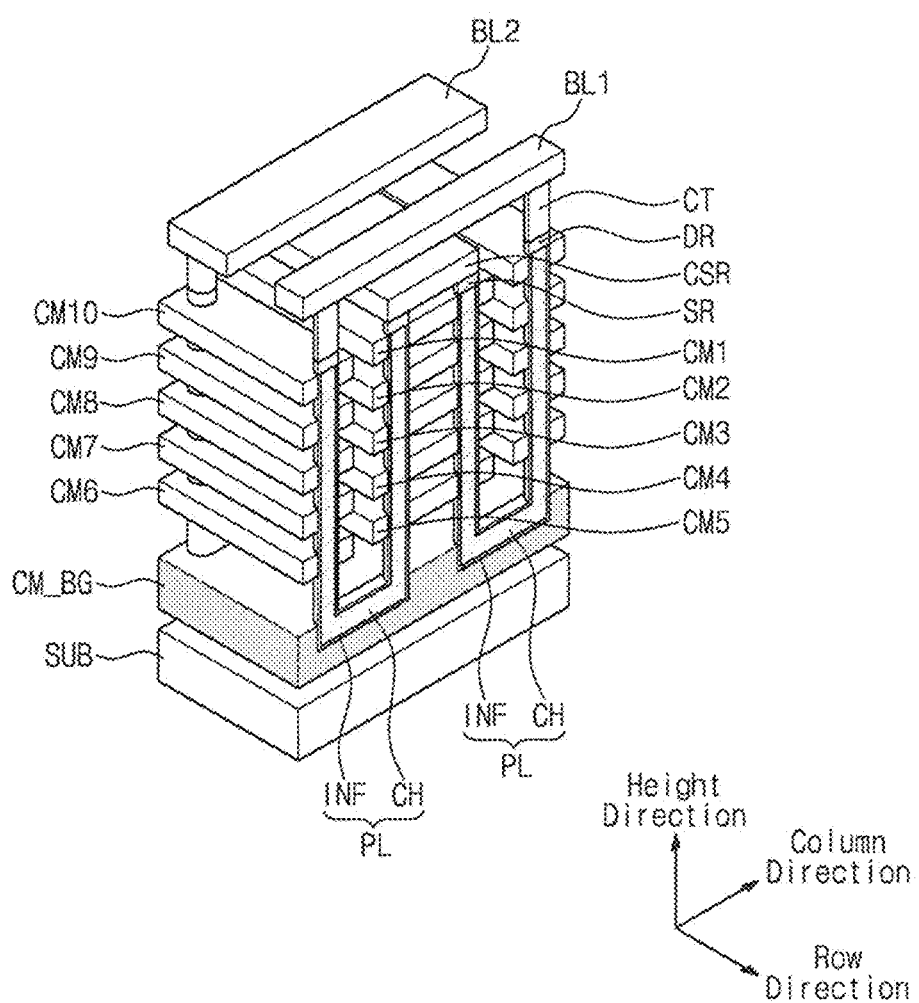
FIG. 11 is a perspective view illustrating another example structure of a memory block of FIG. 1 in accordance with example embodiments of the inventive concepts.

FIG. 11 is a perspective view illustrating another example structure of a memory block BLKa of FIG. 1 in accordance with example embodiments of the inventive concepts. Referring to FIGS. 1 and 11, a conductive material CM_BG of a plane form extending along a row direction and a column direction may be provided on a substrate SUB. The conductive material CM_BG may be electrically separated from the substrate SUB.

In each row of the conductive material, conductive materials of first and second groups may be provided which extend along the row direction and may be separated from one another along the column direction. The conductive material of the first group can include a plurality of conductive materials CM6 to CM10 being stacked in a direction perpendicular to the substrate SUB on the substrate SUB. The conductive materials CM6 to CM10 may be spaced apart from one another along a height direction. The conductive materials CM6 to CM10 may be spaced apart from the conductive material CM_BG along the height direction.

The conductive materials of the second group can include a plurality of conductive materials CM1 to CM5 being stacked in a direction perpendicular to the substrate SUB on the substrate SUB. The conductive materials CM1 to CM5 may be spaced apart from one another along the height direction.

In each row of the conductive material, pillars PL spaced apart from one another along the row direction may be provided. Each pillar PL may penetrate the first through fifth conductive materials CM1 to CM5 to extend to an internal space of the conductive material CM_BG along the height direction perpendicular to the substrate SUB. Each pillar PL may penetrate the sixth through tenth conductive materials CM6 to CM10 to extend to an internal space of the conductive material CM_BG along the height direction perpendicular to the substrate SUB. Each pillar PL may extend in the column direction in the internal space of the conductive material CM_BG and thereby a portion of the pillar PL penetrating the conductive materials CM1 to CM5 and a portion of the pillar PL penetrating the conductive materials CM6 to CM10 may be connected to each other.

Each pillar PL may include an insulating layer INF and a channel layer CH. The insulating layer INF may form a charge capturing layer. The insulating layer INF may also include ONOA (oxide-nitride-oxide-aluminum). The channel layer CH may form an active region.

In each pillar PL, the portion penetrating the conductive materials CM1 to CM5 may be connected to a common source region CSR through a source region SR along the height direction. The source region SR may include semiconductor having an N conductivity type (e.g., silicon). The common source region CSR may include a metallic material or semiconductor.

In each pillar PL, the portion penetrating the conductive materials CM6 to CM10 may be connected to bit line BL through a drain region DR and a contact CT along the height direction. The drain region DR may include semiconductor having an N conductivity type (e.g., silicon).

As described with reference to FIG. 8, the common source region CSR may form a common source line CSL. In each pillar PL, each of the first through tenth conductive materials CM11 to CM10 may correspond to a ground selection line GSL, a word line WL or a string selection line SSL. For example, at least one material closest to the common source region CSR may form the ground selection line. At least one material closest to the drain region DR may form the string selection line. Conductive materials located between conductive material forming the at least one string selection line and conductive material forming the at least one ground selection line may form word lines. The at least one ground selection line may form at least ground selection transistor together with the pillar PL. The at least one string selection line may form at least string selection transistor together with the pillar PL. The word lines WL may form memory cells together with the pillar PL. The conductive material CM_BG may operate as a pass gate forming a channel at a bent part of each pillar PL.

Figure 12:
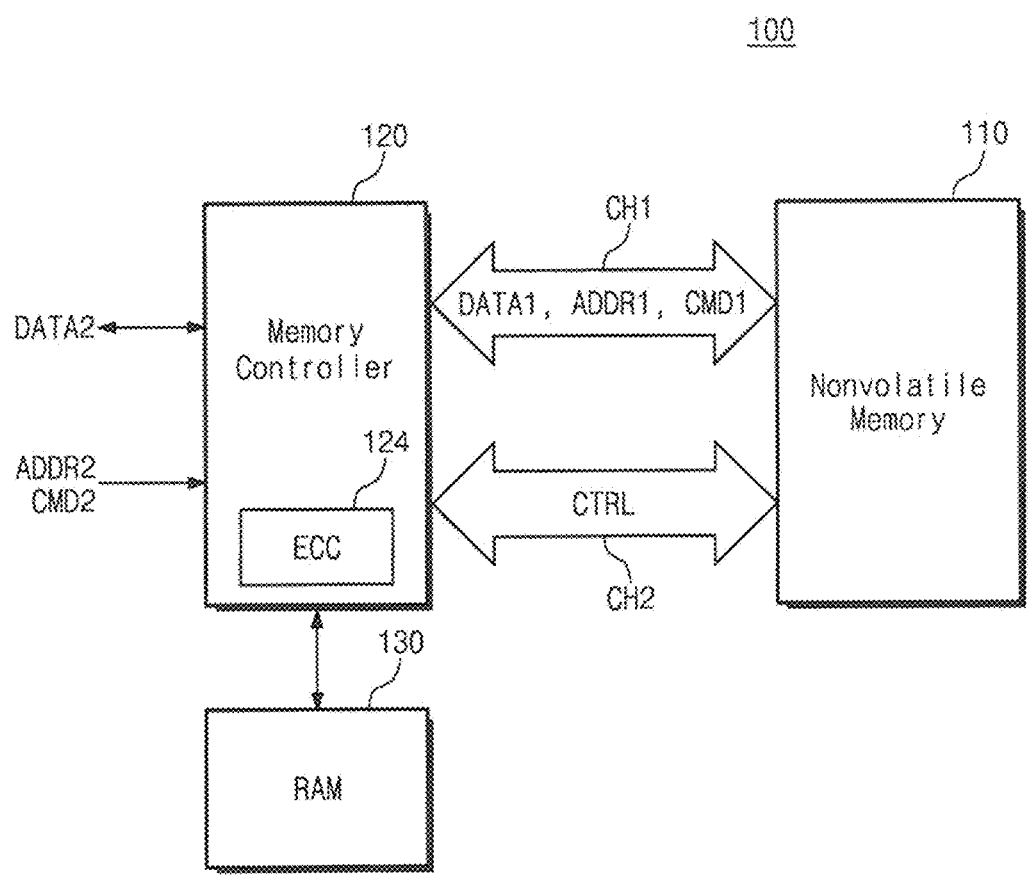
FIG. 12 is a block diagram illustrating a storage device in accordance with example embodiments of the inventive concepts.

FIG. 12 is a block diagram illustrating a storage device 100 in accordance with example embodiments of the inventive concepts. Referring to FIG. 12, the storage device 100 may include a nonvolatile memory 110, a memory controller 120 and a RAM 130.

The nonvolatile memory 110 can perform write, read and erase operations under the control of the memory controller 120. The nonvolatile memory 110 can exchange first data DATA1 with the memory controller 120. For example, the nonvolatile memory 110 can receive the first data DATA1 from the memory controller 120 and write the first data DATA1. The nonvolatile memory 110 can perform a read operation and output the read first data DATA1 to the memory controller 120.

The nonvolatile memory 110 can receive a first command CMD1 and a first address ADDR1 from the memory controller 120. The nonvolatile memory 110 can exchange a control signal CTRL with the memory controller 120. For example, the nonvolatile memory 110 can receive at least one of a chip select signal /CE selecting at least one semiconductor chip among a plurality of semiconductor chips constituting the nonvolatile memory 110, a command latch enable signal CLE indicating that a signal being received from the memory controller 120 is the first command CMD1, an address latch enable signal ALE indicating that a signal being received from the memory controller 120 is the first address ADDR1, a read enable signal /RE which may be generated by the memory controller 120 in a read operation and periodically toggled to adjust the timing, a write enable signal /WE which may be activated by the memory controller 120 when the first command CMD1 or the first address ADDR1 is transmitted, a write preventing signal /WP which may be activated by the memory controller 120 to prevent an unwanted erase or an unwanted write when power supply is changed, and/or a data strobe signal DQS which may be generated by the memory controller 120 in a write operation and may be periodically toggled to adjust an input sync of the first data DATA1 from the memory controller 120. In some embodiments, the nonvolatile memory 110 can output at least one of a ready & busy signal R/nB indicating whether the nonvolatile memory 110 performs a program, erase or read operation, and a data strobe signal DQS which may be generated from the read enable signal /RE by the nonvolatile memory 110 and may be periodically toggled to adjust an output sync of the first data DATA1 to the memory controller 120.

The first data DATA1, the first address ADDR1 and the first command CMD1 can be communicated with the memory controller 120 through a first channel CH1. The first channel CH1 may be an input/output channel. The control signal CTRL can be communicated with the memory controller 120 through a second channel CH2. The second channel CH2 may be a control channel.

The nonvolatile memory 110 may include a flash memory. However, the nonvolatile memory 110 is not limited to include a flash memory. The nonvolatile memory 110 may include at least one of various nonvolatile memories such as a PRAM (phase-change RAM), a MRAM (magnetic RAM), an RRAM (resistive RAM), a FeRAM (ferroelectric RAM), etc.

The memory controller 120 may be configured to control the nonvolatile memory 110. For example, the memory controller 120 can control so that the nonvolatile memory 110 performs a write, read or erase operation. The memory controller 120 can exchange the first data DATA1 and the control signal CTRL with the nonvolatile memory 110 and output the first command CMD1 and the first address ADDR1 to the nonvolatile memory 110.

The memory controller 120 can control the nonvolatile memory 110 under the control of an external host device (not shown). The memory controller 120 can exchange second data DATA2 with the external host device and receive a second command CMD2 and a second address ADDR2 from the external host device.

In some embodiments, the memory controller 120 can exchange the first data DATA1 with the nonvolatile memory 110 by a first unit (for example, time unit or data unit) and exchange the second data DATA2 with the host device by a second unit (for example, time unit or data unit) different from the first unit.

In some embodiments, the memory controller 120 can exchange the first data DATA1 with the nonvolatile memory 110 according to a first format and transmit the first command CMD1 and the first address ADDR1 to the nonvolatile memory 110. The memory controller 120 can exchange the second data DATA2 with the host device according to a second format different from the first format and receive the second command CMD2 and the second address ADDR2 from the host device.

The memory controller 120 can use the RAM 130 as a buffer memory, a cache memory and/or an operation memory, but the inventive concepts are not limited thereto. For example, the memory controller 120 can receive the second data DATA2 from the host device, store the received second data DATA2 in the RAM 130 and write the second data DATA2 stored in the RAM 130 in the nonvolatile memory 110 as the first data DATA1. The memory controller 120 can read the first data DATA1 from the nonvolatile memory 110, store the read first data DATA1 in the RAM 130 and output the first data DATA1 stored in the RAM 130 to the host device as the second data DATA2. The memory controller 120 can store data read from the nonvolatile memory 110 in the RAM 130 and write data stored in the RAM 130 in the nonvolatile memory 110 again.

In some embodiments, the memory controller 120 can store data or a code necessary for managing the nonvolatile memory 110 in the RAM 130. For example, the memory controller 120 can read data or a code necessary for managing the nonvolatile memory 110 from the nonvolatile memory 110 and load it into the RAM 130 to drive it.

In some embodiments, the memory controller 120 may include an ECC (error correcting code) 124. The ECC 124 can generate a parity based on the first data DATA1 being written in the nonvolatile memory 110. The generated parity can be written in the nonvolatile memory 110 together with the first data DATA1. In some embodiments, an operation of generating parity may be an error correction encoding operation. The ECC 124 can receive the first data DATA1 and parity from the nonvolatile memory 110. The ECC 124 can correct an error of the first data DATA1 using the received parity. In some embodiments, an operation of correcting an error may be an error correction decoding operation.

In an error correction decoding operation, the ECC 124 can perform a simplified error correction or a complete error correction. The simplified error correction may be an error correction having reduced error correction time. The complete error correction may be an error correction having improved reliability. In some embodiments, the ECC 124 can improve an operating speed and reliability of the storage device 100 by selectively performing the simplified error correction or the complete error correction.

The RAM 130 may include at least one of various random access memories such as a DRAM (dynamic RAM), a SRAM (static RAM), a SDRAM (synchronous DRAM), a PRAM (phase-change RAM), a MRAM (magnetic RAM), a RRAM (resistive RAM), a FeRAM (ferroelectric RAM), etc, but the inventive concepts are not limited thereto.

In some embodiments, to reduce an overhead that may occur with an erase operation in the nonvolatile memory 110, the storage device 100 may perform an address mapping. For example, when an overwrite operation is requested from the external host device, the storage device 100 may store the overwrite-requested data in memory cells of a free storage space instead of erasing memory cells storing existing data to store the overwrite-requested data in the erased memory cells. The memory controller 120 can drive a FTL (flash translation layer) mapping a logical address being used in the external host device and a physical address being used in the nonvolatile memory 110 according to the method described above. For example, the second address ADDR2 may be a logical address and the first address ADDR1 may be a physical address.

The storage device 100 can perform a write, read or erase operation of data according to a request of the host device. In some embodiments, the storage device 100 may include a SSD (solid state drive) or a HDD (hard disk drive). The storage device 100 may include memory cards such as a personal computer memory card international association (PCMCIA) card, a compact flash (CF) card, a smart media card (SM, SMC), a memory stick, a multimedia card (MMC, RS-MMC, MMCmicro), an SD card (SD, miniSD, microSD, SDHC), a universal flash memory device (UFS), etc, but the inventive concepts are not limited thereto. In some embodiments, the storage device 100 may include a mounted memory such as an eMMC (embedded multimedia card), a UFS, a PPN (perfect page new), etc., but the inventive concepts are not limited thereto.

Figure 13:
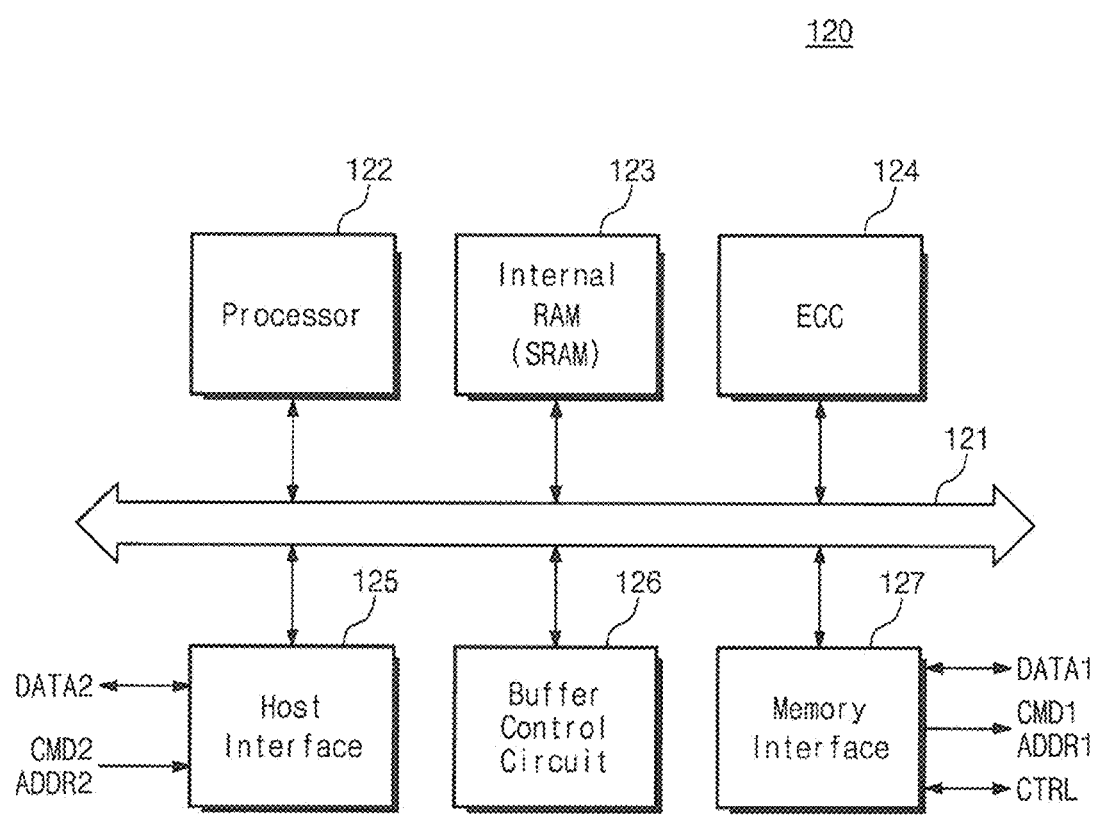
FIG. 13 is a block diagram illustrating a memory controller in accordance with example embodiments of the inventive concepts.

FIG. 13 is a block diagram illustrating a memory controller 120 in accordance with example embodiments of the inventive concepts. Referring to FIG. 13, the memory controller 120 may include a bus 121, a processor 122, an internal RAM 123, an ECC (error correction code) block 124, a host interface 125, a buffer control circuit 126 and a memory interface 127.

The bus 121 is configured to provide a channel between constituent elements of the memory controller 120.

The processor 122 can control an overall operation of the memory controller 120 and perform a logical operation. The processor 122 can communicate with an external host device through the host interface 125. The processor 122 can store a second command CMD2 or a second address ADDR2 being received through the host interface 125 in the internal RAM 123. The processor 122 can generate a first command CMD1 and a first address ADDR1 according to the second command CMD2 or the second address ADDR2 stored in the internal RAM 123 and output the generated first command CMD1 and the first address ADDR1 through the memory interface 127.

The processor 122 can output second data DATA2 being received through the host interface 125 through the buffer control circuit 126 or store the second data DATA2 in the internal RAM 123. The processor 122 can output data stored in the internal RAM 123 or data being received through the buffer control circuit 126 as first data DATA1 through the memory interface 127. The processor 122 can store the first data DATA1 being received through the memory interface 127 in the internal RAM 123 or output the first data DATA1 through the buffer control circuit 126. The processor 122 can output data stored in the internal RAM 123 or data being received through the buffer control circuit 126 as the second data DATA2 through the host interface 125, or can output the data as the first data DATA1 through the memory interface 127.

In some embodiments, the internal RAM 123 may be used as an operation memory, a catch memory and/or a buffer memory. The internal RAM 123 can store codes and commands being executed by the processor 122. The internal RAM 123 can store data being processed by the processor 122. In some embodiments, the internal RAM 123 may include a SRAM.

The ECC block 124 can perform an error correction. The ECC block 124 can generate an error correction code (for example, parity) for performing an error correction on the basis of the first data DATA1 to be output to the memory interface 127 or the second data DATA2 being received from the host interface 125. The first data DATA1 and the parity can be output through the memory interface 127. The ECC block 124 can perform an error correction of the received first data DATA1 using the first data DATA1 and the parity being received through the memory interface 127. In some embodiments, the ECC block 124 may be included in the memory interface 127 as an element of the memory interface 127.

The host interface 125 may be configured to communicate with an external host device under the control of the processor 122. The host interface 125 can receive the second command CMD2 and the second address ADDR2 from the external host device and exchange the second data DATA2 with the external host device.

The host interface 125 may be configured to communicate using at least one of various communication methods such as a USB (universal serial bus), a SATA (serial ATA), a SAS (serial attached SCSI), a HSIC (high speed interchip), a SCSI (small computer system interface), a Firewire (IEEE 1394), a PCI (peripheral component interconnection), a PCIe (PCI express), a NVMe (nonvolatile memory express), a UFS (universal flash storage), an SD (secure digital), a MMC (multimedia card), an eMMC (embedded MMC), etc., but the inventive concepts are not limited thereto.

The buffer control circuit 126 may be configured to control the RAM 130 (outside of the memory controller 120) under the control of the processor 122. The buffer control circuit 126 can write data in the RAM 130 and read data from the RAM 130.

The memory interface 127 is configured to communicate with the nonvolatile memory 110 under the control of the processor 122. The memory interface 127 can transmit the first command CMD1 and the first address ADDR1 to the nonvolatile memory 110 and exchange the first data DATA1 and the control signal CTRL with the nonvolatile memory 110.

The RAM 130 may not be provided to the storage device 100. That is, the storage device 100 may not have a separate memory in the outside of the memory controller 120 and the nonvolatile memory 110. In some embodiments, the buffer controller circuit 126 may not be included in the memory controller 120. In some embodiments, the function of the RAM 130 may be performed by the internal RAM 123 of the memory controller 120.

The processor 122 can control the memory controller 120 using codes. The processor 122 can load codes from a nonvolatile memory (for example, read only memory) being provided inside the memory controller 120. The processor 122 can also load codes being received from the memory interface 127.

The bus 121 of the memory controller 120 may be divided into a control bus and a data bus. The data bus may be configured to transmit data in the memory controller 120 and the control bus may be configured to transmit control information such as a command and an address in the memory controller 120. The data bus and the control bus may be separated from each other and may not interfere with each other or affect each other. The data bus may be connected to the host interface 125, the buffer control circuit 126, the ECC block 124 and the memory interface 127. The control bus may be connected to the host interface 125, the processor 122, the buffer control circuit 126, the internal RAM 123 and the memory interface 127.

According to example embodiments of the inventive concept, bit lines connected to first nodes of bit line selection transistors and lines connected to second nodes of the bit line selection transistors may be disposed on different planes. Thus, a coupling between the bit lines and the lines may be reduced and, since floating lines may be disposed between the bit lines and the lines, reliability of nonvolatile memory devices and storage devices may be improved.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A nonvolatile memory device comprising:
a memory cell array; and
a page buffer circuit connected to the memory cell array through bit lines,
wherein the page buffer circuit comprises:
a substrate;
bit line selection transistors connected to respective ones of the bit lines on the substrate; and
latches connected to the bit line selection transistors through lines on the substrate,
wherein the lines are on a first plane above and parallel to a top surface of the substrate, and are connected to respective ones of the bit line selection transistors through first contacts, and
wherein the bit lines are on a second plane above and parallel to the top surface of the substrate, and are connected to respective ones of the bit line selection transistors through second contacts.

2. The nonvolatile memory device of claim 1, wherein the second plane is above the first plane.

3. The nonvolatile memory device of claim 1, further comprising floating lines on an area adjacent the lines on the second plane.

4. The nonvolatile memory device of claim 3, wherein a width of ones of the floating lines is substantially the same as a width of ones of the bit lines on the second plane.

5. The nonvolatile memory device of claim 1, wherein the lines are first lines and are connected to second lines on a third plane, above and parallel to the top surface of the substrate, through third contacts.

6. The nonvolatile memory device of claim 5, wherein the third plane is above the first and second planes.

7. The nonvolatile memory device of claim 5, wherein the page buffer circuit further comprises:
second bit line selection transistors connected to the memory cell array through second bit lines on the substrate; and
second latches connected to the second bit line selection transistors through third lines on the substrate, respectively,
wherein the third lines are on the first plane and are connected to respective ones of the second bit line selection transistors through fourth contacts, and
wherein the second bit lines are on the second plane and are connected to respective ones of the second bit line selection transistors through fifth contacts.

8. The nonvolatile memory device of claim 7, wherein line widths of the first lines and the third lines are the same.

9. The nonvolatile memory device of claim 7, wherein line widths of the second bit lines and the second lines are the same.

10. The nonvolatile memory device of claim 1, wherein the memory cell array comprises cell strings on a second substrate,
- wherein ones of the cell strings comprise at least one selection transistor and at least one memory cell stacked in a direction perpendicular to the second substrate to form a column, and
- wherein columns of the cell strings are connected to the bit lines respectively.

11. The nonvolatile memory device of claim 10, wherein the at least one selection transistor and the at least one memory cell comprise a charge trap layer.

12. A storage device comprising:
a nonvolatile memory device; and
a memory controller configured to control the nonvolatile memory device,
wherein the nonvolatile memory device comprises:
a memory cell array; and
a page buffer circuit connected to the memory cell array through bit lines,
wherein the page buffer circuit comprises:
a substrate;
bit line selection transistors connected to respective ones of the bit lines on the substrate; and
latches connected to the bit line selection transistors through lines on the substrate,
wherein the lines are on a first plane above and parallel to a top surface of the substrate, and are connected to respective ones of the bit line selection transistors through first contacts, and
wherein the bit lines are on a second plane above and parallel to the top surface of the substrate, and are connected to respective ones of the bit line selection transistors through second contacts.

13. The storage device of claim 12, wherein among the bit line selection transistors, first bit line selection transistors are sequentially disposed along a first direction and second bit line selection transistors are sequentially disposed along the first direction in parallel with the first bit line selection transistors, and
- wherein on an area between the first bit line selection transistors and the second bit line selection transistors, the bit lines extend along the first direction and are spaced apart from one another along a second direction perpendicular to the first direction.

14. The storage device of claim 13, wherein a first bit line among the bit lines turns in the second direction at a location of a corresponding first bit line select transistor, to extend on an upper portion of the corresponding first bit line selection transistor.

15. The storage device of claim 13, further comprising floating lines being disposed on the second plane at a region that does not cross the bit lines, and above upper portions of the first bit line selection transistors and the second bit line selection transistors.

16. A nonvolatile memory device comprising:
a memory cell array; and
a page buffer circuit, wherein the page buffer circuit comprises:
a substrate;
a plurality of layers above the substrate, wherein respective ones of the plurality of layers are parallel to a top surface of the substrate;
lines disposed in a first layer of the plurality of layers;
bit lines disposed in a second layer of the plurality of layers, wherein the bit lines connect the page buffer circuit to the memory cell array;
a plurality of floating lines disposed in the second layer;
a plurality of bit line selection transistors connected to respective ones of the bit lines on the substrate; and
a plurality of latches connected to the plurality of bit line selection transistors through the lines on the substrate.

17. The nonvolatile device of claim 16, wherein the plurality of bit line selection transistors comprise first bit line selection transistors and second bit line selection transistors,
- wherein the first bit line selection transistors are sequentially disposed along a first direction and the second bit line selection transistors are sequentially disposed along the first direction in parallel with the first bit line selection transistors, and
- wherein the bit lines are on an area between the first bit line selection transistors and the second bit line selection transistors, extend along the first direction, and are spaced apart from one another along a second direction perpendicular to the first direction.

18. The nonvolatile device of claim 17, wherein selected ones of the floating lines are between, in the second direction, portions of the lines disposed in the first layer and portions of the bit lines disposed in the second layer.

19. The nonvolatile device of claim 16, wherein a width of the floating lines disposed in the second layer is substantially the same as a width of the bit lines disposed in the second layer, and
- wherein a width of the lines disposed in the first layer is greater than the width of the bit lines disposed in the second layer.

20. The nonvolatile device of claim 19, wherein a space between adjacent ones of the lines disposed in the first layer is greater than a space between ones of the floating lines adjacent ones of the bit lines disposed in the second layer.

* * * * *